United States Patent [19]

Mimoto

[11] Patent Number: 4,716,303

[45] Date of Patent: Dec. 29, 1987

[54] MOS IC PULL-UP CIRCUIT

[75] Inventor: Toshio Mimoto, Nara, Japan

[73] Assignee: Sharp Kabushiki Kaisha, Osaka, Japan

[21] Appl. No.: 729,190

[22] Filed: May 1, 1985

[51] Int. Cl.[4] .......................................... H03K 19/096
[52] U.S. Cl. .................................... 307/264; 307/577; 307/48 Z
[58] Field of Search ...................... 307/246, 264, 200 B, 307/443, 48 Z, 448, 269, 450, 491, 577, 296 R, 578; 365/203, 205, 207, 208, 222

[56] References Cited

U.S. PATENT DOCUMENTS

| | | |
|---|---|---|
| 4,382,194 | 5/1983 | Nakano et al. ..................... 307/48 Z |
| 4,398,100 | 8/1983 | Tobita et al. ..................... 307/48 Z |
| 4,511,811 | 4/1985 | Gupta ..................... 307/264 |

Primary Examiner—Stanley D. Miller
Assistant Examiner—Timothy P. Callahan
Attorney, Agent, or Firm—Birch, Stewart, Kolasch & Birch

[57] ABSTRACT

In MOS ICs, particularly dynamic memory elements and the like which have a boosted signal, a pull-up circuit in the MOS IC is provided to statically hold the boosted signal output to the desired potential when power is turned on and during the active state.

1 Claim, 5 Drawing Figures

MOS IC PULL-UP CIRCUIT

BACKGROUND OF THE INVENTION

This invention concerns the improvement of a MOS IC pull-up circuit, specifically a MOS IC with a new pull-up circuit which includes a boosted signal for dynamic memory elements and the like, in which the boosted signal output is statically held.

In the past, in for example a word wire drive circuit or bit wire precharge circuit, etc. of a dynamic memory element, a pull-up circuit was used to statically hold the signal output that is boosted to above the power source voltage while it is active.

FIG. 3 illustrates the output portion of the conventional timing generation circuit used to generate the boosted signal.

In FIG. 3, (1) is the timing generation circuit, which is of such a configuration that the output signal $\phi$OUT is boosted by the boosting MOS capacitance (2). $\phi$A is an active signal of a value equal to the power source voltage level output during the active period to enable the output signal $\phi$OUT to attain high potential, which functions as a pull-up element during the active period of the MOS type electric field effect transistor (hereinafter simply referred to as MOSFET), conducting to effect a pull-up operation when the output signal $\phi$OUT is of a lower value than the power source voltage Vcc (not shown) (Vcc−Vt) where Vt is the threshold voltage of MOSFET (3). This type of conventional circuit had the following inherent problems.

Namely, in FIG. 3, the pull-up element (3) does not function when the output signal level of $\phi$OUT is (VCC−Vt) or more. Therefore, even if the output signal $\phi$OUT is set to a value equal or higher than the power source voltage (Vcc+Vb), the MOSFET (3) is interrupted during the active state, the output potential decreases due to various types of leaking currents, and the potential at which MOSFET (3) becomes active gradually drops, as shown in FIG. 4.

When a signal with these types of characteristics is used with a word wire drive signal or bit wire precharge signal of a dynamic memory element, limitations on the maximum cycle period and refresh time occur.

Furthermore, in the circuit in FIG. 3, when MOS 3 becomes active immediately after power is turned on when this circuit is used, for example, in a bit wire precharge signal of a dynamic memory element, while the timing generation circuit (1) is not initialized or the synchronous signal to operate the timing generation circuit is not input, MOSFET3 is the only signal output as shown in FIG. 5, and (Vcc−Vt) becomes the upper limit of pull-up voltage.

Therefore, in a normal dynamic memory element, several cycles of synchronous signals must be input to initialize the timing generation circuit (1) and a dummy cycle provided to output a normal boosted signal output $\phi$OUT.

OBJECT AND SUMMARY OF THE INVENTION

The object of the invention is to solve the above problems using the above as a model, providing a pull-up circuit for a MOS IC to statically pull-up the boosted signal output to the desired potential when power is turned on, and during the active state.

To achieve this objective, a 1st MOS type electric field effect transistor with the drain connected to the power source and the active signal input to the gate, a 2nd MOS type electric field effect transistor with the gate and the drain connected together and the source connected to the previously mentioned boosted signal output, a 3rd MOS type electric field transistor, a 4th MOS type electric field transistor and a MOS capacity are provided in a MOS IC pull-up circuit to statically hold the boosted signal output at a level equal or higher than the power source voltage during the active state.

The source of the previously mentioned 1st MOS type electric field effect transistor and the drain of the previously mentioned 2nd MOS type electric field effect transistor are connected, the said MOS capacity is connected in between this connection point and the source of the previously mentioned 3rd MOS type electric field effect transistor, the gate of the 3rd MOS type electric field transistor is connected to the signal output through the 4th MOS type electric field effect transistor and a circuit is added so that a signal is repeatedly input to the drain of the 3rd MOS type electric field effect transistor.

The above configuration in this invention enables the operating limitations on MOS ICs to be reduced, and eliminates unstable element characteristics when the power is first turned on.

DETAILED DESCRIPTION OF THE INVENTION

The figures will now be described in connection with a detailed explanation of an embodiment of this invention.

Figure 1:
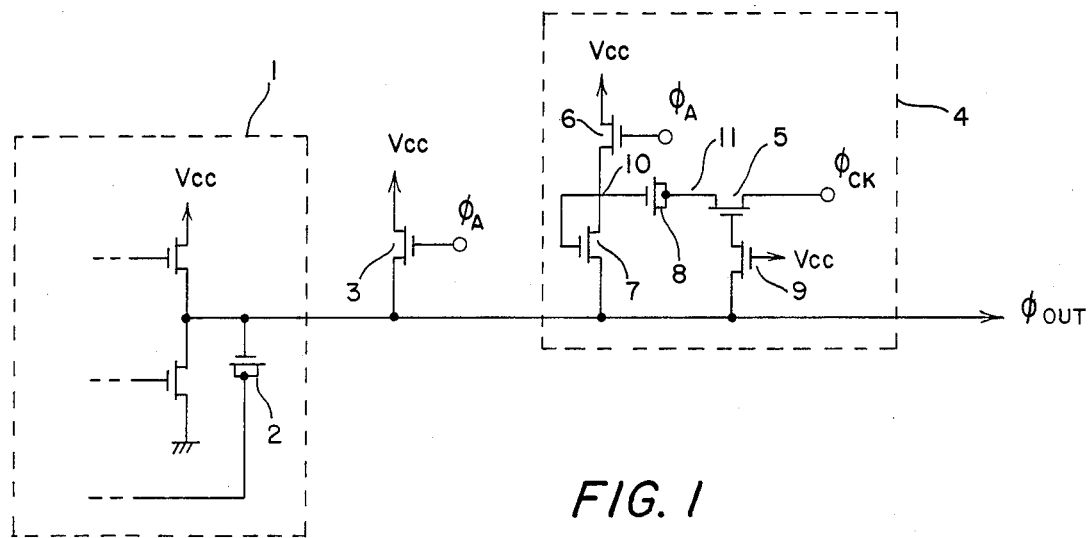
FIG. 1 is an embodiment of the MOS IC pull-up circuit.

FIG. 1 is a circuit diagram illustrating the configuration of an embodiment of this invention.

Figure 2:
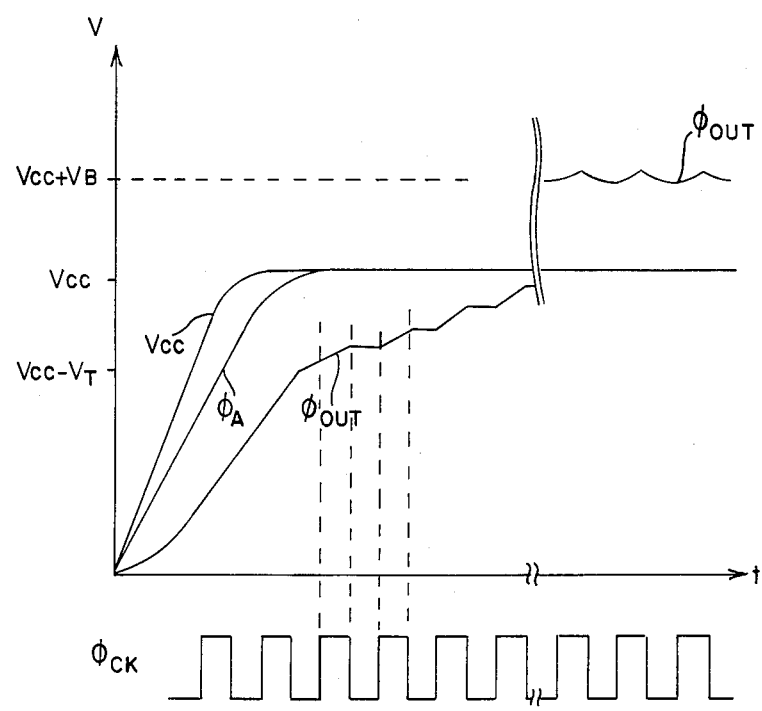
FIG. 2 illustrates the boosting characteristics of this circuit.
Figure 3:
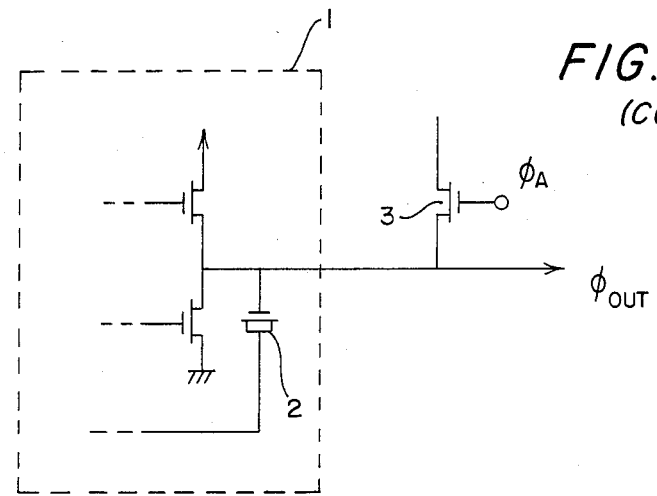
FIG. 3 shows the configuration of a conventional pull-up circuit.
Figure 4:
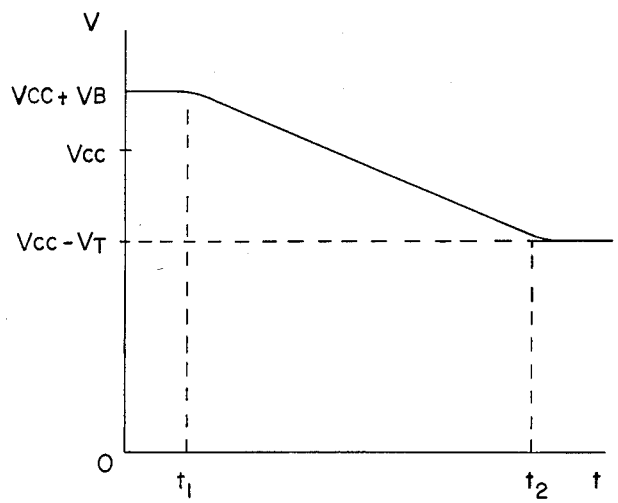
FIGS. 4 and 5 are circuit diagrams respectively showing boosted signal characteristics in conventional circuits.
Figure 5:
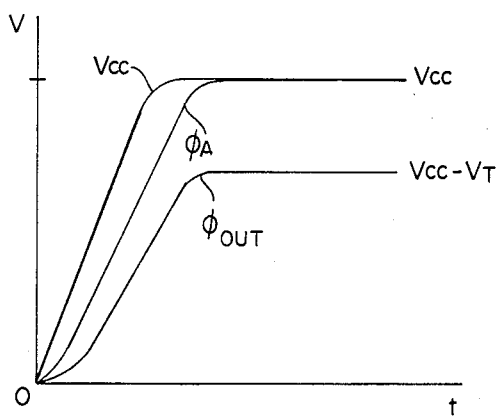

In FIG. 1, (1) is the conventional type of timing generation circuit and (2) the boosting MOS capacity. (3) is the pull-up MOSFET used in the past, with an active signal $\phi$A of the same level as the power source voltage being input to the gate, the drain connected to the power source, and the source connected to the boosted signal output ($\phi$OUT) wire which is the output wire of the timing generation circuit (1). (4) is one example of the pull-up circuit that is added according to this invention, which comprises a 1st MOSFET (6), a 2nd MOSFET (7), a 3rd MOSFET (5), a 4th MOSFET (9) and MOS capacity (8); the drain of the 1st MOSFET (6) is connected to the power source, an active signal $\phi$A is supplied to the gate, the source is connected to the signal output ($\phi$OUT) wire through the drain and source of MOSFET (7), the gate and drain of MOSFET (7) are connected together, the MOS capacity (8) is connected between this connection point (10) and the source of the 3rd MOSFET (5), and the gate of the 3rd MOSFET (5) is connected to the boosted signal output ($\phi$OUT) wire through the source, drain passage of the 4th MOSFET (9) which has its gate connected to the power source. Furthermore, the signal $\phi$CK is input to the drain of the 3rd MOSFET (5). This signal $\phi$CK, as shown in FIG. 2, is a periodic signal of the same level as the power source voltage (Vcc), and the oscillation output signal of the circuit board bias voltage generation circuit can be used with normal dynamic memory elements and the like.

The functioning of the embodiment of this invention stated above will now be explained.

(1) First, output of a voltage to φOUT which has been boosted to Vcc or more during the active period while the power source voltage level (Vcc ) is input to the active signal φA inputs will be explained.

In this case a high potential is applied to the gate of MOSFET (5) through MOSFET (9), MOSFET (5) goes to the conductive state, node (11) follows the periodic signal φCK, and continuous changing back and forth between the power source voltage level Vcc and earth potential.

On the other hand, a power source voltage Vcc level active signal φA is input to the gate of MOSFET (6), node (10) is charged to the potential of (Vcc−Vt) through MOSFET (6) with node (11) at the earth level. Here, Vt is the threshold voltage of MOSFET (6).

Next, upon transition of the node (11) to the power source voltage level Vcc, node (10) is boosted to (2 Vcc−Vt) potential, this electric charge flows to the boosted signal φOUT through MOSFET (7), and the pull-up operation is effected to compensate for the drop due to the leaking current of φOUT.

Since the boosted signal φOUT leaking current is minute, MOSFET (5), (6), (7), (9) and the MOS capacity (8), which comprise the pull-up circuit, can be made sufficiently small.

(2) Next, an explanation of operation when the active signal φA is at earth potential (non-active period) will be made.

In this case, the boosted signal φOUT is at the earth level, and since the gate of MOSFET (5) is fixed at the earth level through MOSFET (9), MOSFET (5) is in an OFF state, the periodic signal φCK is not transferred to the MOS capacity (8), and since MOSFET (6) is OFF, circuit (4) does not effect a pull-up operation, and no power is consumed.

(3) Next, the active condition immediately after power is turned on will be explained.

When the circuit is used to shift to the active condition immediately after power is turned on (e.g. bit wire precharge signal, etc.), the active signal φA rises to the power source voltage Vcc level as the power source rises.

This condition is shown in FIG. 2. In this case charging with MOSFET (3) is first commenced, and the signal output φOUT is boosted to (Vcc−Vt), where the MOSFET (3) threshold voltage is Vt.

On the other hand, as the signal output φOUT rises, MOSFET (5) goes to the conductive stage through MOSFET (9), the same operation as explained in (1) above is effected by the circuit in the embodiment of this invention, and the signal output φOUT finally rises to a value equal or higher than the power source voltage.

As explained above, with this invention, a signal boosted to a level equal or higher than the power source voltage can be selectively or statically pulled-up for the required duration, and stable element characteristics are ensured when initialization is effected immediately after power is turned on.

What is claimed is:

1. A MOS IC pull-up circuit for statically holding a signal outputted during an active stage of a dynamic memory element, which signal has been boosted to a level at least equal to a power source voltage, comprising:

a first MOSFET having a drain terminal connected to said power source and a gate terminal connected to a node of an active signal representative of said active stage;

a second MOSFET having a drain terminal and a gate terminal both connected to a source terminal of said first MOSFET, and a source terminal connected to said boosted signal;

a third MOSFET;

a fourth MOSFET;

a MOS capacitance;

said MOS capacitance being connected between a source terminal of said third MOSFET and said source terminal of said first MOSFET, a gate terminal of said third MOSFET being connected to said boosted signal through a source-drain channel of said fourth MOSFET, a gate terminal of said fourth MOSFET being connected to said power source, and a periodic signal being connected to a drain terminal of said third MOSFET, said boosted signal being held at a level at least equal to said power source voltage during said active stage, through a boosting operation of said first through fourth MOSFETS and said MOS capacitance.

* * * * *